(12) United States Patent
Schild

(10) Patent No.: US 11,695,365 B2
(45) Date of Patent: Jul. 4, 2023

(54) METHOD AND DEVICE FOR EXTERNAL MONITORING OF A CONVERTER

(71) Applicant: Robert Bosch GmbH, Stuttgart (DE)

(72) Inventor: Johannes Schild, Abstatt (DE)

(73) Assignee: Robert Bosch GmbH, Stuttgart (DE)

( * ) Notice: Subject to any disclaimer, the term of this patent is extended or adjusted under 35 U.S.C. 154(b) by 125 days.

(21) Appl. No.: 16/967,790

(22) PCT Filed: Dec. 28, 2018

(86) PCT No.: PCT/EP2018/097102
§ 371 (c)(1),
(2) Date: Aug. 6, 2020

(87) PCT Pub. No.: WO2019/154555
PCT Pub. Date: Aug. 15, 2019

(65) Prior Publication Data
US 2020/0395841 A1    Dec. 17, 2020

(30) Foreign Application Priority Data

Feb. 8, 2018    (DE) ..................... 10 2018 201 953.3
Sep. 25, 2018    (DE) ..................... 10 2018 216 334.0

(51) Int. Cl.
*H02M 1/32*        (2007.01)
*H02P 29/02*        (2016.01)
(Continued)

(52) U.S. Cl.
CPC .............. *H02P 29/02* (2013.01); *B60L 3/003* (2013.01); *B60L 3/0061* (2013.01);
(Continued)

(58) Field of Classification Search
USPC ........................................................ 318/139
See application file for complete search history.

(56) References Cited

U.S. PATENT DOCUMENTS

| 2010/0273072 A1 | 10/2010 | Hasegawa et al. |
| 2016/0181954 A1* | 6/2016 | Satou ................. H02P 6/28 318/400.22 |
| 2018/0354384 A1* | 12/2018 | Lu ................... H01M 10/48 |

FOREIGN PATENT DOCUMENTS

| CN | 100364228 C | * 1/2008 | ............... B60K 6/44 |
| CN | 103477524 A | * 12/2013 | ....... H01L 31/02021 |

(Continued)

OTHER PUBLICATIONS

Method and Device for External Monitoring of Power Electronics Document ID WO 2018001598 A1;Date Filed Apr. 25, 2017; Date Published Jan. 4, 2018 (Year: 2018).*

(Continued)

*Primary Examiner* — Jorge L Carrasquillo
(74) *Attorney, Agent, or Firm* — Michael Best & Friedrich, LLP

(57) ABSTRACT

The invention relates to a method for the external monitoring of a converter (10), the converter (10) being controlled by means of a first electronic control system (12) and the method being implemented by means of a second electronic control system (14) which is independent from the first electronic control system (12). Said method comprises detection (S1) of a current (I) received by the converter (10) and a voltage (U) received by the converter (10) by means of a current/voltage sensor device (16) which is independent from the first electronic control system (12). The invention also relates to a device for monitoring a converter (10), to a computer program product, to a machine-readable storage medium, to a drive train of a motor vehicle, and to a corresponding motor vehicle.

12 Claims, 1 Drawing Sheet

(51) Int. Cl.
*B60L 3/00* (2019.01)
*B60L 3/04* (2006.01)
*B60L 50/60* (2019.01)
*G01R 21/06* (2006.01)
*G01R 31/56* (2020.01)
*G01P 3/44* (2006.01)
*H02M 1/00* (2006.01)
*H02J 7/00* (2006.01)

(52) U.S. Cl.
CPC .............. *B60L 3/0084* (2013.01); *B60L 3/04* (2013.01); *B60L 50/60* (2019.02); *G01P 3/44* (2013.01); *G01R 21/06* (2013.01); *G01R 31/56* (2020.01); *H02M 1/32* (2013.01); *B60L 2240/527* (2013.01); *B60L 2240/529* (2013.01); *H02J 7/0047* (2013.01); *H02M 1/0009* (2021.05)

(56) References Cited

FOREIGN PATENT DOCUMENTS

| | | | |
|---|---|---|---|
| DE | 102011050719 | | 12/2012 |
| DE | 102015226161 | | 6/2017 |
| JP | H0923508 A | * | 1/1997 |
| JP | H10304509 A | * | 11/1998 |
| JP | 2001272422 A | * | 10/2001 |
| JP | 2005269752 A | * | 9/2005 |
| JP | 2009207315 A | * | 9/2009 |
| WO | 03069768 | | 8/2003 |
| WO | WO-2012091183 A1 | * | 7/2012 ............ B60L 11/123 |
| WO | 2018001598 | | 1/2018 |

OTHER PUBLICATIONS

International Search Report for Application No. PCT/EP2018/097102 dated Apr. 3, 2019 (English Translation, 2 pages).

\* cited by examiner

METHOD AND DEVICE FOR EXTERNAL MONITORING OF A CONVERTER

BACKGROUND OF THE INVENTION

The invention relates to a method and an apparatus for externally monitoring a converter. Furthermore, the invention relates to a drivetrain having a corresponding apparatus and to a motor vehicle having a drivetrain and also to a computer program product and a machine-readable storage medium.

An electric or hybrid vehicle is driven by at least one electric motor, which is controlled by a converter, and possibly additionally by an internal combustion engine. Detection of the driver's wishes and splitting of the setpoint torque over the drives is performed in a vehicle control unit (VCU), and moment control is provided in control electronics of the converter that are assigned to the electric machine.

Such control electronics usually have their own monitoring and are therefore inherently safe to a certain extent. A measure of the integrity of the monitoring is the ASIL defined by ISO 26262, the ASIL providing the integrity levels ASIL A, B, C and D.

Conventional converters often have an integrity level of ASIL B to ensure a maximum permissible difference between an actual moment and a setpoint moment. In some motor vehicle applications, for example when using powerful E-motors in conjunction with rear axle drive and for example a low vehicle weight, a higher ASIL may be called for, however, in particular in driving situations at high speed, e.g. above 40 km/h, and for large differences between the actual and setpoint moments.

DE 10 2015 226 161 A1 discloses an electric drive system having a first and a second inverter, and having a converter circuit, designed to monitor a phase current flowing between the output connections of the first and second inverters and the electric machine.

SUMMARY OF THE INVENTION

The present invention provides a method for externally monitoring a converter, wherein the converter is actuated by means of first control electronics and the method is carried out by means of second control electronics, which are independent of the first control electronics. The method comprises detecting a current received by the converter and a voltage received by the converter by means of a current/voltage sensor device that is independent of the first control electronics. The method also comprises ascertaining an actual output power provided by the converter, by using the captured variables of the current received by the converter and the voltage received by the converter. The method also comprises determining a difference between the ascertained actual output power and a setpoint output power of the converter. The method moreover comprises actuating the converter if an absolute value of a difference between the actual output power and the setpoint output power of the converter exceeds a predetermined limit value.

The present invention additionally provides an apparatus for monitoring a converter, wherein the converter is actuated by means of first control electronics, wherein the apparatus comprises independent second control electronics configured to use a current/voltage sensor device, which is independent of the first control electronics, to detect a current received by the converter and a voltage received by the converter, to ascertain therefrom an actual output power provided by the converter, to determine a difference between the ascertained actual output power and a setpoint output power of the converter, and to actuate the converter if an absolute value of a difference between the actual output power and the setpoint output power of the converter exceeds a predetermined limit value.

The present invention furthermore provides a computer program product configured to carry out the method according to the invention and a machine-readable storage medium on which the computer program product is stored.

The invention moreover relates to a drivetrain of a motor vehicle having the apparatus according to the invention, a converter, first control electronics and an electric machine or an energy source. The invention additionally relates to a motor vehicle having the drivetrain according to the invention.

It is a notion of the present invention to use the detecting of a current received by the converter and of a voltage received by the converter by a current/voltage sensor device, which is independent of the first control electronics, to externally capture the aforementioned parameters, i.e. these parameters are not provided by the first control electronics that control the converter but rather are ascertained and provided independently thereof by an external apparatus. This allows the integrity of the overall system to be increased and hence the safety of the electric or hybrid vehicle to be enhanced.

Advantageous embodiments and developments become apparent from the subclaims and from the description with reference to the figures.

According to a further preferred development, there is provision for the captured variables of the current received by the converter and the voltage received by the converter to be plausibilized with the setpoint output power of the converter.

According to a preferred development, there is provision for a speed of an electric machine operated by the converter to be ascertained by means of third control electronics, in particular of an ESP control unit, of a gearbox control unit or of a further converter, that are independent of the first control electronics.

The ascertained speed of the electric machine can advantageously be plausibilized with the setpoint output power of the converter in addition to the captured variables of the current received by the converter and the voltage received by the converter.

It is therefore advantageously possible to ensure that the current received by the converter and the voltage received by the converter and the speed of the electric machine are plausible with the setpoint output power of the converter.

According to a further preferred development, there is provision for the actuating of the converter to comprise the specifying of a control requirement for the first control electronics. The control requirement can comprise for example the specifying of a torque for the converter, for example a torque of 0. The control requirement can also be a requirement for the first control electronics to transfer the converter to a safe state. Advantageously, a possibility of reacting to the discovery of an erroneous response from the converter is provided.

According to a further preferred development, there is provision for the actuating of the converter to comprise a switching-off of the converter if the specified control requirement is implemented erroneously, wherein the switching-off of the converter is performed within an error reaction time of the converter. The converter can therefore advantageously be transferred to a safe state within the error reaction time.

According to a further preferred development, there is provision for the actual output power of the converter to be determined by using an electrical loss of the converter, a mechanical loss of the electric machine, a tolerance of the actual output voltage and an actual output current of the converter. The aforementioned parameters are therefore used for determining the actual output power of the converter, which allows precise calculation of the actual output power of the converter.

According to a further preferred development, there is provision for the switching-off of the power electronics to comprise a switching of an "enable line" of the converter to "low". Only if a level of the "enable line" is at "high" is operation of the output stages of the converter possible. The level of the "enable line" is in particular at "high" if an applied voltage exceeds a threshold value. If the level of the "enable line" is at "low", a flow of energy through the output stages of the power electronics is not possible.

According to a further preferred development, there is provision for the current/voltage sensor device to be integrated in a traction battery of an electric or hybrid vehicle. It is therefore advantageously possible for an already present current/voltage sensor device to be used for determining the current received by the converter and the voltage received by the converter.

According to a further preferred development, there is provision for the apparatus to comprise third control electronics, formed in particular by an ESP control unit, a gearbox control unit or a further converter, that are independent of the first control electronics, the third control electronics being configured to ascertain a speed of an electric machine operated by the converter. The ascertained speed of the electric machine therefore advantageously contributes to its being plausibilized with setpoint output power in addition to the current received by the converter and the voltage received by the converter.

The refinements and developments described can be combined with one another as desired.

Further possible refinements, developments and implementations of the invention also encompass combinations not explicitly mentioned of features of the invention that are described above or below in respect of the exemplary embodiments.

BRIEF DESCRIPTION OF THE DRAWINGS

The accompanying drawings are supposed to convey a further understanding of the embodiments of the invention. They illustrate embodiments and, in association with the description, serve to explain principles and concepts of the invention.

Other embodiments and many of the advantages mentioned will become apparent with reference to the drawings. The depicted elements of the drawings are not necessarily shown to scale with respect to one another.

In the drawings:

FIG. 1 shows a block diagram of an apparatus for externally monitoring a converter according to a preferred embodiment of the invention; and FIG. 2 shows a flowchart for a method for externally monitoring the converter according to the preferred embodiment of the invention.

DETAILED DESCRIPTION

In the figures of the drawings, identical reference signs denote identical or functionally identical elements, parts or components, unless indicated to the contrary.

Figure 1:
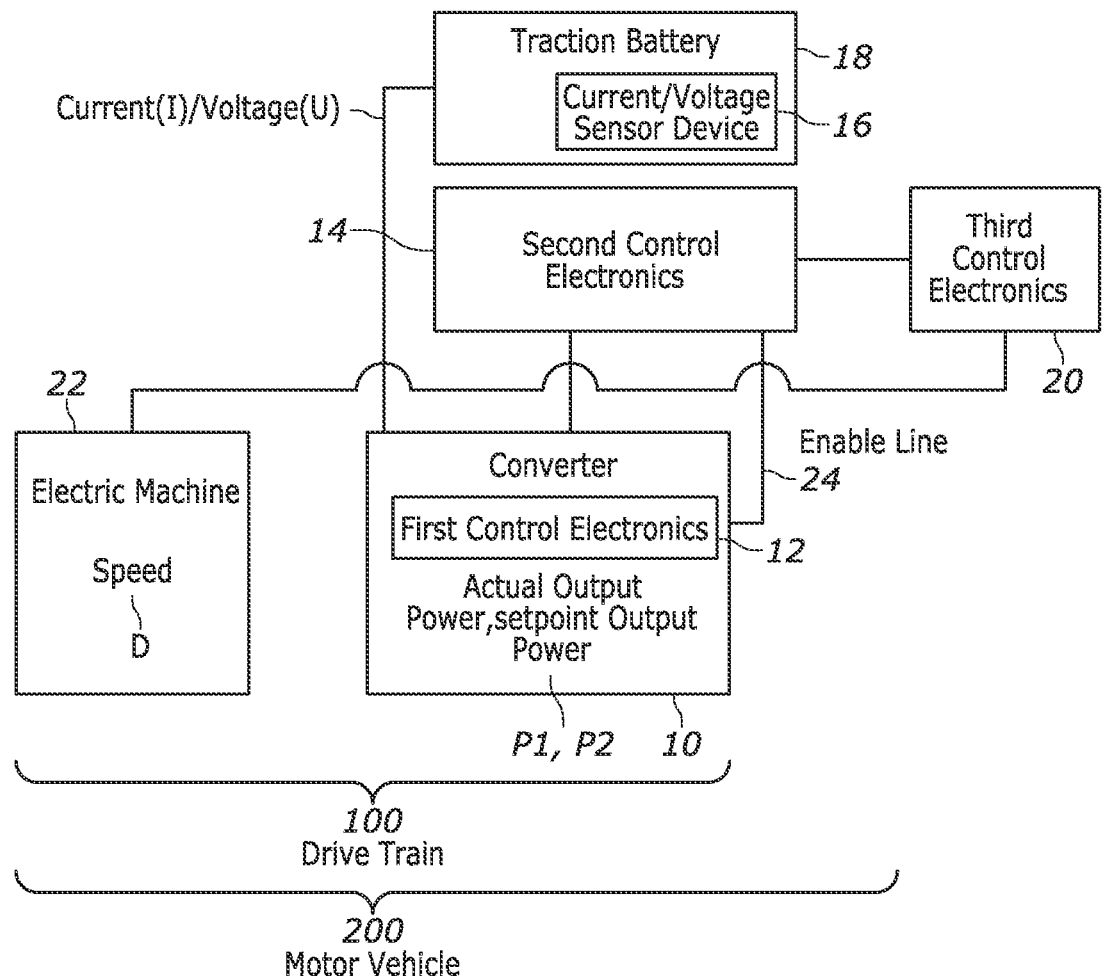

FIG. 1 shows a block diagram of an apparatus for externally monitoring a converter according to a preferred embodiment of the invention.

The apparatus for monitoring a converter 10 has at least second control electronics 14, a current/voltage sensor device 16 and third control electronics 20, which are independent of first control electronics 12.

The converter 10 is actuated by means of the first control electronics 12. The apparatus has the second control electronics 14, which are independent of the first control electronics 12. The second control electronics 14 are configured to use a current/voltage sensor device 16, which is independent of the first control electronics 12, to detect a current I received by the converter 10 and a voltage U received by the converter.

Further, the second control electronics 14 are designed to use these variables to ascertain an actual output power P1 provided by the converter 10.

Furthermore, the second control electronics 14 are designed to determine a difference between the ascertained actual output power P1 and a setpoint output power P2 of the converter 10.

Further, the second control electronics 14 are designed to actuate the converter 10 if an absolute value of a difference between the actual output power P1 and the setpoint output power P2 of the converter 10 exceeds a predetermined limit value.

The current/voltage sensor device 16 is integrated in a traction battery 18 of an electric or hybrid vehicle, for example.

Further, the apparatus has provision for the third control electronics 20 that are independent of the first control electronics 12. The third control electronics 20 can be formed by an ESP control unit, for example. Alternatively, the third control electronics 20 can be formed by a gearbox control unit or a further converter, for example.

The third control electronics 20 are designed to ascertain the speed D of an electric machine 22 operated by the converter 10. Further, a drivetrain 100 of a motor vehicle 200 and the motor vehicle 200 are depicted symbolically.

Figure 2:
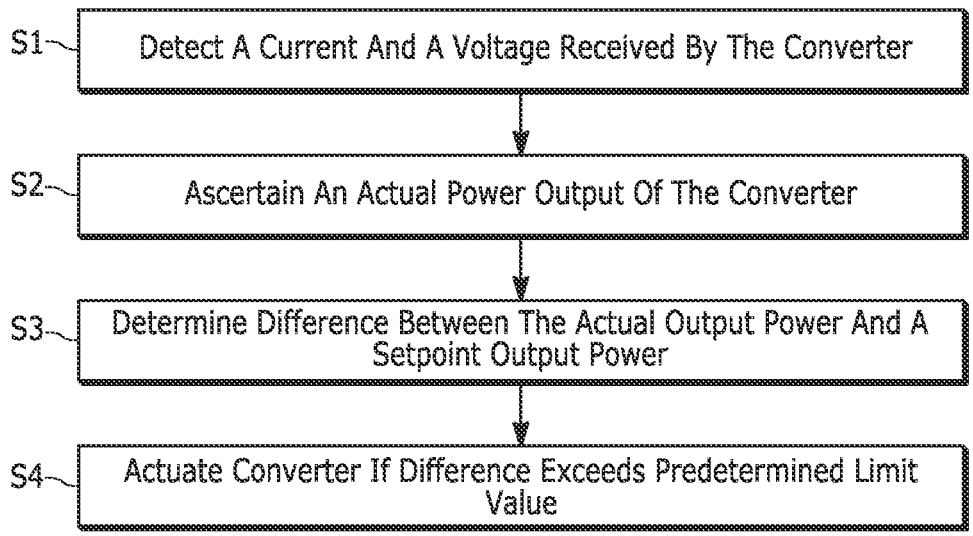

FIG. 2 shows a flowchart for a method for externally monitoring the converter according to the preferred embodiment of the invention.

The method for externally monitoring the converter 10 is carried out such that the converter 10 is actuated by means of first control electronics 12 and the method is carried out by means of second control electronics 14 that are independent of the first control electronics 12.

The method comprises detecting S1 a current I received by the converter 10 and a voltage U received by the converter 10 by means of a current/voltage sensor device 16 that is independent of the first control electronics 12.

The method further comprises ascertaining S2 an actual output power P1 provided by the converter 10, by using the captured variables of the current I received by the converter 10 and the voltage U received by the converter 10.

The method further comprises determining S3 a difference between the ascertained actual output power P1 and a setpoint output power P2 of the converter 10.

The method moreover comprises actuating S4 the converter 10 if an absolute value of a difference between the actual output power P1 and the setpoint output power P2 of the converter 10 exceeds a predetermined limit value.

A speed D of an electric machine 22 operated by the converter 10 can optionally be ascertained by means of third control electronics 20, in particular of an ESP control unit, of a gearbox control unit or of a further converter 10, that are independent of the first control electronics 12.

A vehicle control unit (VCU) specifies a setpoint torque for the electric machine 22, wherein the ascertained speed D of the electric machine 22 is used to calculate therefrom a setpoint output power P2 of the converter 10.

The current received by the converter 10 and the voltage received by the converter 10 are plausibilized with the setpoint output power P2 of the converter 10 by the second control electronics 14. The actuating of the converter 10 comprises the specifying of a control requirement for the first control electronics 12, for example.

The actuating of the converter 10 comprises a switching-off of the converter 10 if the specified control requirement is implemented erroneously, wherein the switching-off of the converter 10 is performed within an error reaction time of the converter 10.

The actual output power P1 of the converter 10 is determined for example by using an electrical loss of the converter 10, a mechanical loss of the electric machine, a tolerance of an actual output voltage and an actual output current of the converter 10. The switching-off of the power electronics optionally comprises a switching of an "enable line" of the converter 10 to "low".

Although the present invention has been described on the basis of preferred exemplary embodiments hereinabove, it is not restricted thereto, but rather is modifiable in a wide variety of ways. In particular, the invention can be altered or modified in many ways without departing from the essence of the invention.

By way of example, a circuit, a number and/or a combination of the components used can be modified on the basis of respective requirements.

The invention claimed is:

1. A method for externally monitoring a converter (10), wherein the converter (10) is actuated by first control electronics (12) and the method is carried out by second control electronics (14) separate from the first control electronics, the method having the steps of:
   detecting (S1), via a current/voltage sensor device (16) separate from the first control electronics, a current (I) received by the converter (10) and a voltage (U) received by the converter (10);
   ascertaining (S2) an actual output power (P1) provided by the converter (10) using the detected current (I) received by the converter (10) and the detected voltage (U) received by the converter (10);
   determining (S3) a difference between the ascertained actual output power (P1) provided by the converter (10) and a setpoint output power (P2) of the converter (10); and
   actuating (S4), via the first control electronics, the converter (10) if an absolute value of a difference between the actual output power (P1) provided by the converter (10) and the setpoint output power (P2) of the converter (10) exceeds a predetermined limit value,
   wherein actuating of the converter (10) includes the specifying of a control requirement for the first control electronics (12),
   wherein actuating of the converter (10) includes a switching-off of the converter (10) if the specified control requirement is implemented erroneously and the switching-off of the converter (10) is performed within an error reaction time of the converter (10),
   wherein a speed (D) of an electric machine (22) operated by the converter (10) is ascertained by third control electronics (20) including an ESP control unit, a gearbox control unit or a further converter, that are separate from the first control electronics (12), wherein the second control electronics (14) calculates the setpoint output power (P2) of the converter (10) based on the speed (D) of the electric machine (22), and
   wherein the current/voltage sensor device (16) is integrated in a traction battery (18) of an electric or hybrid vehicle.

2. The method as claimed in claim 1, characterized in that the switching-off of the power electronics comprises a switching of an "enable line" (24) of the converter (10) to "low".

3. A computer program product configured to carry out the method as claimed in claim 1.

4. A machine-readable storage medium on which the computer program product as claimed in claim 3 is stored.

5. The method as claimed in claim 1, characterized in that a speed (D) of an electric machine (22) operated by the converter (10) is ascertained by third control electronics (20) including an ESP control unit, a gearbox control unit or a further converter (10), that are separate from the first control electronics (12).

6. The method as claimed in claim 5, characterized in that the actual output power (P1) of the converter (10) is determined by using an electrical loss of the converter (10), a mechanical loss of the electric machine (22), a tolerance of an actual output voltage and an actual output current of the converter (10).

7. The method as claimed in claim 6, characterized in that the switching-off of the power electronics comprises a switching of an "enable line" (24) of the converter (10) to "low".

8. The method as claimed in claim 1, wherein the first control electronics (12) is located within the converter (10).

9. An apparatus for monitoring a converter (10), wherein the converter (10) is actuated by first control electronics (12), wherein the apparatus comprises second control electronics (14) configured to use a current/voltage sensor device (16), which is separate from the first control electronics (12), to detect a current (I) received by the converter (10) and a voltage (U) received by the converter (10), to ascertain an actual output power (P1) provided by the converter (10) using the detected current (I) received by the converter (10) and the detected voltage (U) received by the converter (10), to determine a difference between the ascertained actual output power (P1) provided by the converter (10) and a setpoint output power (P2) of the converter (10), and to actuate, by the first control electronics (12), the converter (10) if an absolute value of a difference between the actual output power (P1) provided by the converter (10) and the setpoint output power (P2) of the converter (10) exceeds a predetermined limit value, wherein actuating of the converter (10) includes the specifying of a control requirement for the first control electronics (12), wherein actuating of the converter (10) includes a switching-off of the converter (10) if the specified control requirement is implemented erroneously and the switching-off of the converter (10) is performed within an error reaction time of the converter (10), wherein the apparatus has third control electronics (20) including an ESP control unit, a gearbox control unit or a further converter, that are separate from the first control electronics (12) and configured to ascertain a speed (D) of an electric machine (22) operated by the converter (10), wherein the second control electronics (14) calculates the setpoint output power (P2) of the converter (10) based on the speed (D) of the electric machine (22), and wherein the current/voltage sensor device (16) is integrated in a traction battery (18) of an electric or hybrid vehicle.

10. A drivetrain (100) of a motor vehicle (200) having an apparatus as claimed in claim 9, a converter (10), first control electronics (12) and an electric machine (22) or an energy source.

11. A motor vehicle (200) having a drivetrain (100) as claimed in claim 10.

12. The apparatus as claimed in claim 9, wherein the first control electronics (12) is located within the converter (10).

* * * * *